(12) United States Patent
Watanuki (10) Patent No.: US 7,370,304 B2
(45) Date of Patent: May 6, 2008

(54) SYSTEM AND METHOD FOR DESIGNING AND MANUFACTURING LSI

(75) Inventor: Shinichi Watanuki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 63 days.

(21) Appl. No.: 11/181,925

(22) Filed: Jul. 15, 2005

(65) Prior Publication Data
US 2006/0015837 A1 Jan. 19, 2006

(30) Foreign Application Priority Data
Jul. 16, 2004 (JP) .............................. 2004-210482

(51) Int. Cl.
*G06F 17/50* (2006.01)
(52) U.S. Cl. ............................................ 716/8; 716/11
(58) Field of Classification Search ............... 716/8–12
See application file for complete search history.

(56) References Cited
U.S. PATENT DOCUMENTS
6,033,812 A  3/2000 Miyagawa 6,308,143 B1 * 10/2001 Segawa .......................... 703/1
6,813,756 B2 * 11/2004 Igarashi et al. ............... 716/14
2002/0184606 A1 * 12/2002 Ohba et al. .................... 716/11

FOREIGN PATENT DOCUMENTS
CN    1135602 C    1/2004

* cited by examiner

*Primary Examiner*—Jack Chiang
*Assistant Examiner*—Binh Tat
(74) *Attorney, Agent, or Firm*—Foley & Lardner LLP (57) ABSTRACT

An LSI designing system includes a memory;, a database configured to store a layout layer definition file, and a control section configured to refer to the database to build up a plurality of layout layers in the memory based on the layout layer definition file. The plurality of layout layers are provided for extending directions of patterns in one of physical layers of an LSI to be formed. The control section divides each of the patterns into pattern structures based on the extending directions, and assigns each of the pattern structures to a corresponding one of the plurality of layout layers.

15 Claims, 7 Drawing Sheets

LAYOUT LAYER DEFINITION FILE 11

| LAYOUT LAYER | ALLOCATED STRUCTURE |
|---|---|
| Layer-P1 | LATERAL POLYSILICON LAYER |
| Layer-P2 | LONGITUDINAL POLYSILICON LAYER |

| LAYOUT LAYER | FIGURE DATA |
|---|---|
| Layer-P1 | COORDINATE$(a_1 \sim a_4)$, $(c_1 \sim c_4)$, $(d_1 \sim d_4)$ |
| Layer-P2 | COORDINATE$(b_1 \sim b_4)$, $(e_1 \sim e_4)$ |

SYSTEM AND METHOD FOR DESIGNING AND MANUFACTURING LSI

BACKGROUND OF THE INVENTION

1. Field of the Invention

The present invention relates to a design technique of an LSI, and more particularly relates to a system and method for designing and manufacturing an LSI, and an electron beam (EB) data generating system for generating an EB data used in an electronic beam drawing apparatus.

2. Description of the Related Art

It is essential to use a computer for LSI design in order to reduce the time for design and check and remove an artificial mistake. A software program used for the LSI design is referred to as a CAD (Computer Aided Design) program. In the CAD program, a plurality of [Layout Layers (Digitized Layers)] are defined. A designer carries out the LSI design by arranging data of desirable pattern structures in the plurality of layout layers defined on the computer. In this way, a [Layout Data] indicating the pattern configuration of the designed LSI is obtained on the computer. Here, the pattern structure to be formed in a same physical layer is arranged in a same layout layer.

Also, in the foregoing LSI design, it is necessary to carry out the design for the LSI to meet [Design Rules]. The design rules defines a minimum pattern dimension and a minimum space dimension for each layout layer, and position relation between the layout layers in detail. It is necessary to obedience the design rules for the formation of a desirable device. A software program for checking whether or not the generated layout data meets the design rules is referred to as [DRC (Design Rule Checker)]. The designer modifies the layout data in accordance with an error data outputted by the DRC.

A reticle used in a lithography process is produced in accordance with the layout data generated in this way. In order to produce the reticle having a mask pattern determined based on the layout data, for example, [Electronic Beam (EB) Drawing Apparatus] is used. Here, it is necessary to convert the layout data into [EB Data] having a format suitable for the EB drawing apparatus (hereafter, referred to as [EB Data Converting Process]). For this reason, it is necessary to carry out a figure calculating process such as an inter-layer logic calculation, and a white/black inverting process.

In association with the higher integration and larger scale of the LSI, the number of layout patterns increases more and more. A large amount of time is required when all the layout patterns defined for the foregoing high integrated LSI are sequentially converted into the EB data. This causes a period for the design and development of the LSI to be made longer. For this reason, it is desired to provide the layout data suitable for the figure converting process.

SUMMARY OF THE INVENTION

In an aspect of the present invention, an LSI designing system includes a memory, a database configured to store a layout layer definition file, and a control section configured to refer to the database to build up a plurality of layout layers in the memory based on the layout layer definition file. The plurality of layout layers are provided for extending directions of patterns in one of physical layers of an LSI to be formed. The control section divides each of the patterns into pattern structures based on the extending directions, and assigns each of the pattern structures to a corresponding one of the plurality of layout layers.

Here, the control section may produce a layout data for the physical layer by combining the plurality of layout layers.

Also, the control section may assign the pattern structures to the corresponding layout layer by specifying apexes of each of the pattern structures.

Also, the extending directions may be orthogonal to each other.

Also, the control section may carry out the building up of the plurality of layout layers over all of the physical layers of the LSI to be formed, and the assignment of each of the pattern structures to a corresponding layout layer.

Also, when the database further stores a design rule file, the control section may refer to the design rule file to check whether each of the plurality of layout layers meets design rules defined in the design rule file.

In another aspect of the present invention, an electron beam drawing system includes an electron beam data generating system configured to generate an electron beam data for one of physical layers of an LSI to be formed; and an electron beam drawing apparatus configured to draw a mask pattern based on the electron beam data. The electron beam data generating system includes an LSI designing system configured to generate a layout data for the physical layer; and a converting unit configured to convert the layout data into the electron beam data. The LSI designing system includes a memory; a database configured to store a layout layer definition file; and a control section configured to refer to the database to build up a plurality of layout layers in the memory based on the layout layer definition file. The plurality of layout layers are provided for extending directions of patterns in the physical layer. The control section divides each of the patterns into pattern structures based on the extending directions, assigns each of the pattern structures to a corresponding one of the plurality of layout layers, and produces the layout data for the physical layer by combining the plurality of layout layers.

In another aspect of the present invention, a method of manufacturing an LSI, may be achieved by generating a layout data for one of physical layers of the LSI to be manufactured; by producing a mask based on the layout data; and by manufacturing the LSI by using the mask. The generating a layout data may be achieved by building up a plurality of layout layers in a memory based on a layout layer definition file, wherein the plurality of layout layers are provided for extending directions of patterns in the physical layer of the LSI; by dividing each of the patterns into pattern structures based on the extending directions; by assigning each of the pattern structures to a corresponding one of the plurality of layout layers; and by generating the layout data for the physical layer by combining the plurality of layout layers.

Here, the assigning may be achieved by assigning the pattern structures to the corresponding layout layer by specifying apexes of each of the pattern structures.

Also, the extending directions may be orthogonal to each other.

Also, the generating a layout data is carried out over all of the physical layers.

Also, the generating a layout data may be achieved by further checking whether each of the plurality of layout layers meets design rules defined.

Also, the producing a mask may be achieved by generating an electron beam data for the physical layer; and by drawing a mask pattern based on the electron beam data to produce the mask.

In another aspect of the present invention, a layout data generating method may be achieved by building up a plurality of layout layers in a memory based on a layout layer definition file, wherein the plurality of layout layers are provided for extending directions of patterns in the physical layer of the LSI; by dividing each of the patterns into pattern structures based on the extending directions; by assigning each of the pattern structures to a corresponding one of the plurality of layout layers; and by generating the layout data for the physical layer by combining the plurality of layout layers.

DESCRIPTION OF THE PREFERRED EMBODIMENTS

Hereinafter, an LSI designing system using a database, an LSI designing method, and an EB data generating system according to the present invention will be described below with reference to the attached drawings.

Configuration

Figure 1:
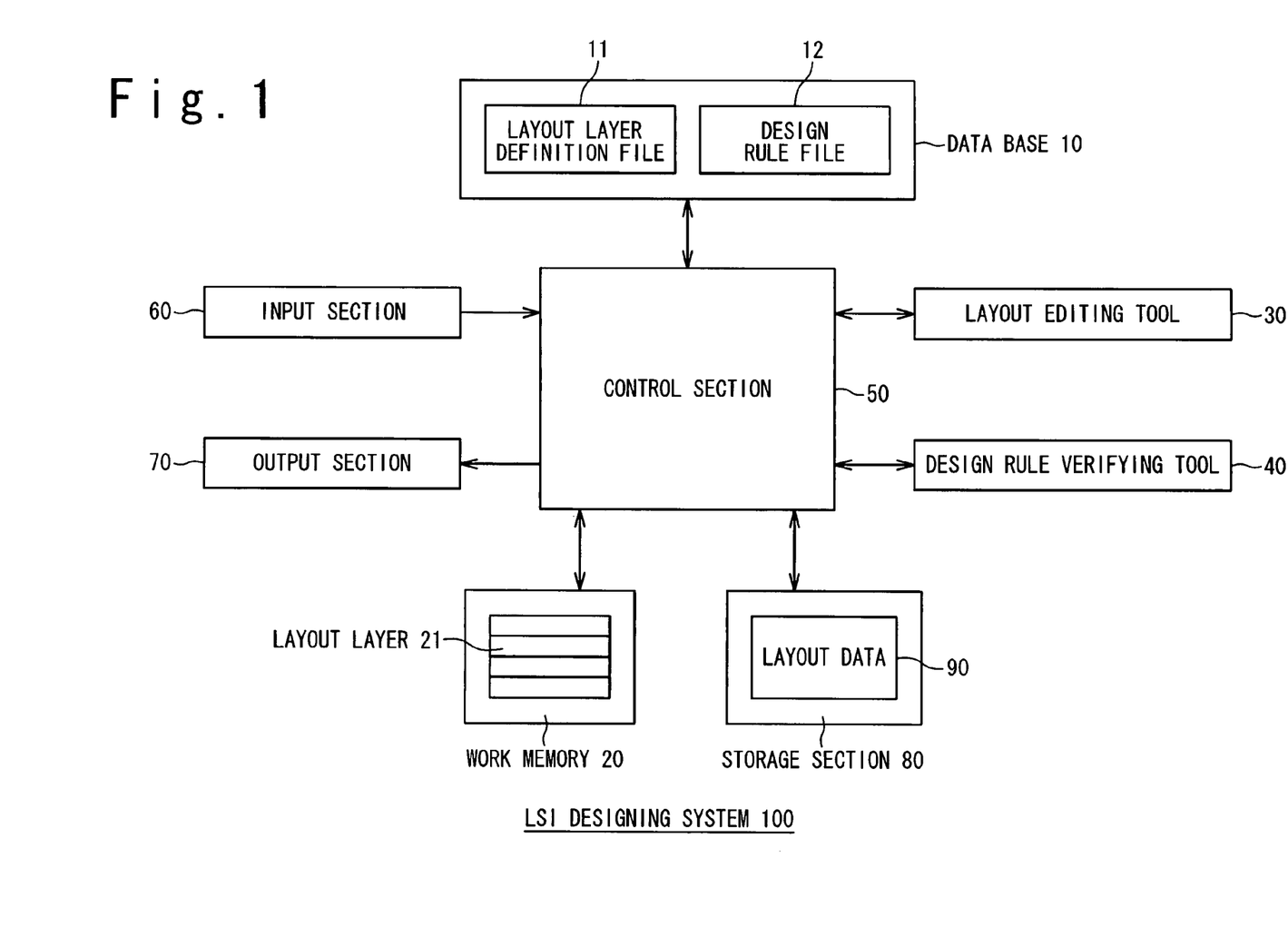
FIG. 1 is a block diagram showing a configuration of an LSI designing system according to an embodiment of the present invention.

FIG. 1 is a block diagram showing a configuration of the LSI designing system according to an embodiment of the present invention. The LSI designing system 100 includes a database 10, a work memory 20, a layout editing tool 30, a design rule verifying tool 40, a control section 50, an input section 60, an output section 70 and a storage section 80. The LSI designing system 100 is configured on a workstation, or a plurality of workstations connected to each other through a network.

The control section 50 includes a program executing section such as a central processing section (CPU) installed on the workstation. The control section 50 is connected to the respective sections, and controls the operations of the respective sections and carries out transmission and reception of data between them. The work memory 20 is a memory region used for an LSI design and connected to the control section 50. A plurality of [Layout Layers (Digitized Layers) 21] used in the LSI design are built up on the work memory 20.

The database 10 stores a file group for the LSI design and is connected to the control section 50. Specifically, the database 10 has a [Layout Layer Definition File] 11 and a [Design Rule File] 12. The layout layer definition file 11 indicates the definitions of a plurality of layout layers 21 built up on the work memory 20, which will be described later in detail. The design rule file 12 indicates [Design Rules] to the plurality of layout layers 21. The design rules define a minimum pattern dimension and a minimum space dimension for each layout layer 21 and a position relation between the layout layers 21 in detail.

The layout editing tool 30 is accessibly connected to the database 10 and the work memory 20. The layout editing tool 30 is realized by a computer program executed by the control section 50. The layout editing tool 30 arranges a pattern structure in the layout layer 21 on the work memory 20 in response to an instruction from the designer. Pattern structures are arranged in the plurality of layout layers 21 for the LSI design on the work memory 20 by repeating the above operation. Thus, the layout editing tool 30 generates a [Layout Data] 90 indicating the configuration of the designed LSI.

The design rule verifying tool (DRC) 40 is accessibly connected to the database 10 and the work memory 20. The design rule verifying tool 40 is achieved by a computer program executed by the control section 50. The design rule verifying tool 40 refers to the design rule file 12 stored in the database 10 to verify whether the designed LSI indicated based on the layout data 90 meets the design rules indicated by the design rule file 12. If the designed LSI does not meet the design rules, the design rule verifying tool 40 outputs an error signal.

The input section 60 and the output section 70 are connected to the control section 50. A keyboard and a mouth are exemplified as the input section 60. The designer of the LSI can input various specifications and instructions from the input section 60 to the LSI designing system 100. The inputted specifications and instructions are processed by the control section 50. Also, a display and a speaker are exemplified as the output section 70. The LSI designer can know the current design situation of the LSI through the output section 70. Also, the error signal from the design rule verifying tool 40 is reported through the output section 70 to the designer by the control section 50. When hearing the error signal, the designer can use the input section 60 to modify the LSI design (the layout data 90).

A hard disc unit connected to the control section 50 is exemplified as the storage section 80. The storage section 80 stores the generated layout data 90.

Figure 2:
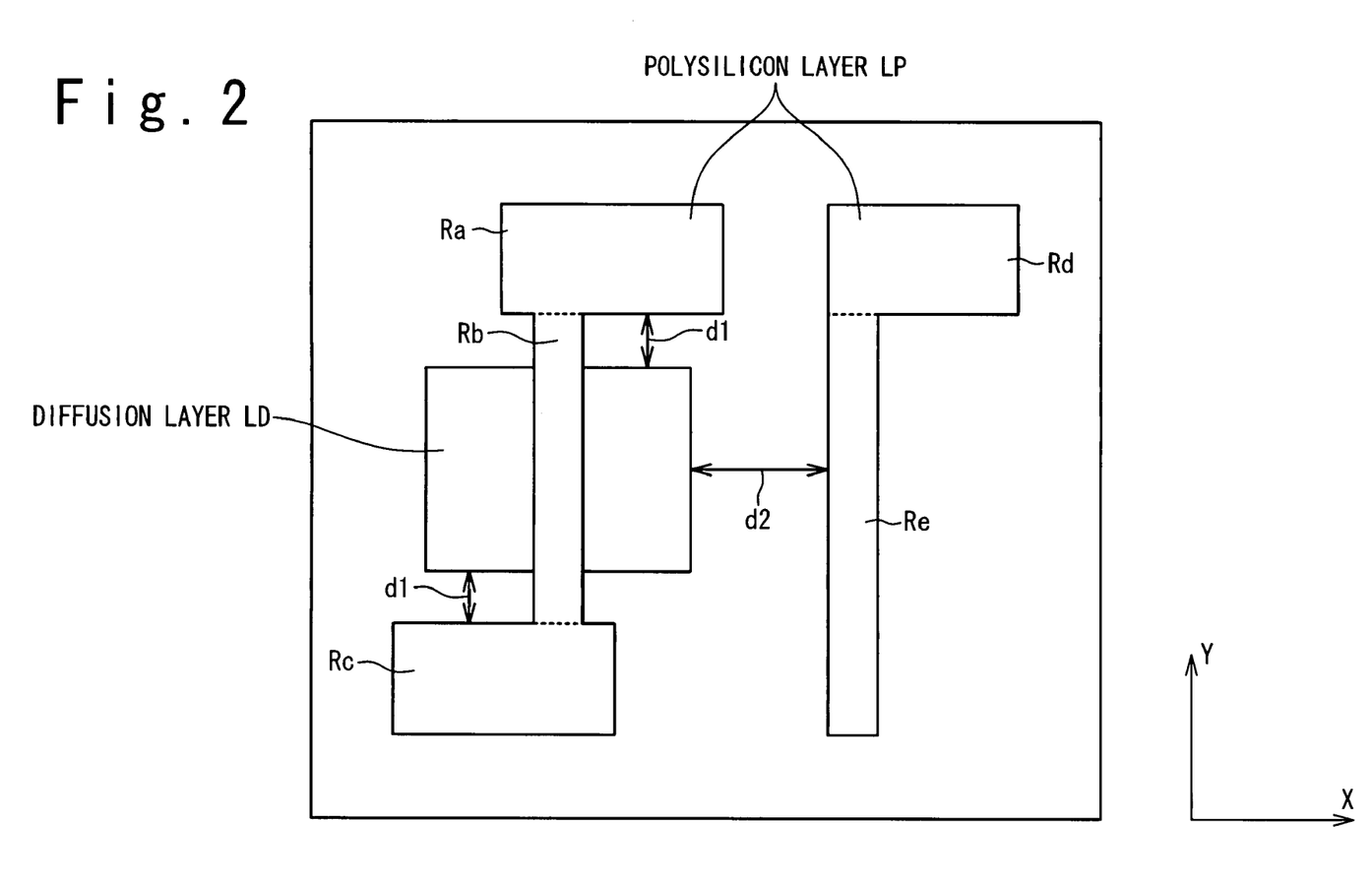
FIG. 2 is a conceptual diagram showing an example of LSI design in the embodiment of the present invention.

FIG. 2 is a conceptual diagram showing an example of the LSI design in the embodiment of the present invention. In FIG. 2, the gate structure of a certain transistor is designed. In short, a diffusion layer LD and a polysilicon layer LP covering the diffusion layer LD are formed. Here, as shown in FIG. 2, the polysilicon layer LP can be divided into a plurality of regions Ra to Re as pattern structures. The plurality of regions Ra to Re can be classified into two groups on the basis of their longer side directions. That is, the regions Ra, Rc and Rd belong to a group of [Lateral Polysilicon] extending in an X-direction (lateral direction) in FIG. 2. On the other hand, the regions Rb and Re belong to a group of [Longitudinal Polysilicon] extending in a Y-direction (longitudinal direction) in FIG. 2. Preferably, the X-direction and the Y-direction are orthogonal to each other.

On the work memory 20, the respective pattern structures are arranged on any of the plurality of layout layers 21. For example, the diffusion layer LD is arranged in a certain layout layer 21 for the diffusion layer. Also, according to the present invention, the different layout layers 21 of the plurality of layout layers 21 are assigned to the [Lateral Polysilicon] group and the [Longitudinal Polysilicon] group. In short, the pattern structures of the lateral polysilicon group and the pattern structures of the longitudinal polysilicon group are formed so as to be connected to each other on a same physical layer. However, on the work memory 20, they are arranged on the different layout layers 21. Also, the division of the polysilicon layer LP into the plurality of regions Ra to Re may be carried out before or after the building up of the plurality of layout layers.

Figure 3:
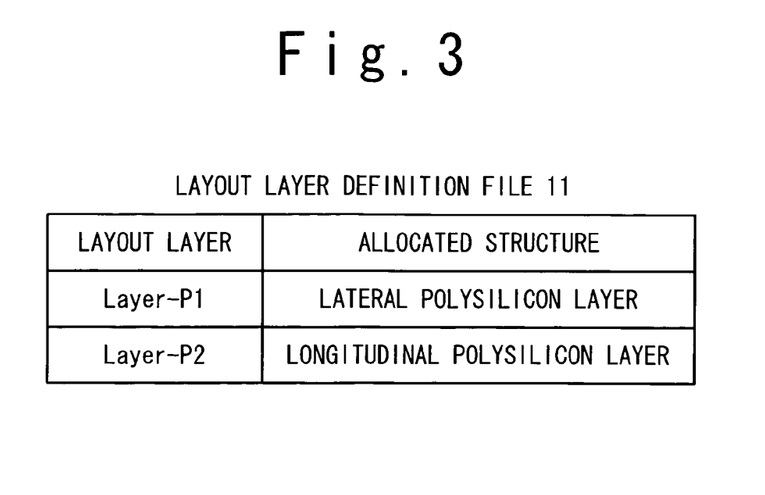
FIG. 3 is a diagram showing an example of a layout layer definition file according to the embodiment of the present invention.

FIG. 3 shows an example of the layout layer definition file 11 to define the plurality of layout layers 21. The layout layer definition file 11 is a file in a text format. As shown in FIG. 3, the layout layer definition file 11 assigns lateral pattern structures of the lateral polysilicon group to a Layer-P1 of the plurality of layout layers 21. Also, the layout layer definition file 11 assigns longitudinal pattern structures of the longitudinal polysilicon layer group to a Layer-P2 of the plurality of layout layers 21. In this way, the layout layer definition file 11 according to the present invention defines the arranged pattern structures and the longer side directions of the pattern structures (i.e., the X-direction or the Y-direction) for each of the plurality of layout layers 21. In short, each of the plurality of layout layers 21 is defined to have an [Orientation]. Thus, according to the present invention, even in the pattern structures to be formed in the same physical layer, they are arranged in the different layout layers 21, depending on the longer side directions of the pattern structures. It should be noted that FIG. 3 shows only the Layer-P1 and Layer-P2. However, the pattern structures are assigned to three or more of the layout layers 21. Also, the layout layer definition file 11 actually gives the definitions to each of the layout layers 21.

The design rule file 12 is stored in the database 10 to indicate the design rules to each of the plurality of layout layers 21. The design rules define a minimum pattern dimension and a minimum space dimension for each layout layer 21 and the position relation between the layout layers 21. For example, a minimum space dimension d1 between a lateral pattern structure in the Layer-P1 and the diffusion layer LD shown in FIG. 2, and a minimum space dimension d2 between the longitudinal pattern structure in the Layer-P2 and the diffusion layer LD. Here, constraints can be independently given to the minimum space dimension d1 and the minimum space dimension d2. Thus, the design rules becomes minute. In particular, since the finer structure of the LSI has been further advanced in recent years, the constraints on the design such as the direction become necessary, in order to make the processing dimensional precision higher. According to the design rules based on the present invention, it is possible to easily cope with the constraints on the design as mentioned above. Moreover, the plurality of layout layers 21 are provided in accordance with the longer side directions and the pattern structures. Therefore, it is not necessary to incorporate [Information of Direction] into the definitions of the minimum space dimensions d1 and d2. Thus, the design rules related to the present invention are simplified over the conventional design rules that need to always include [Information of Direction].

Operation

The operation of the LSI designing system 100 according to the present invention will be described below. Here, as an example, it is supposed that the configuration shown in FIG. 2 is designed.

The database 10, the layout editing tool 30 and the design rule verifying tool 40 are provided. The database 10 includes the layout layer definition file 11 (refer to FIG. 3) and the design rule file 12. The layout editing tool 30 and the design rule verifying tool 40 are the software programs executed by the control section 50. The designer can use the layout editing tool 30 and the design rule verifying tool 40 through the input section 60 and their results are outputted on the output section 70.

Figure 4:
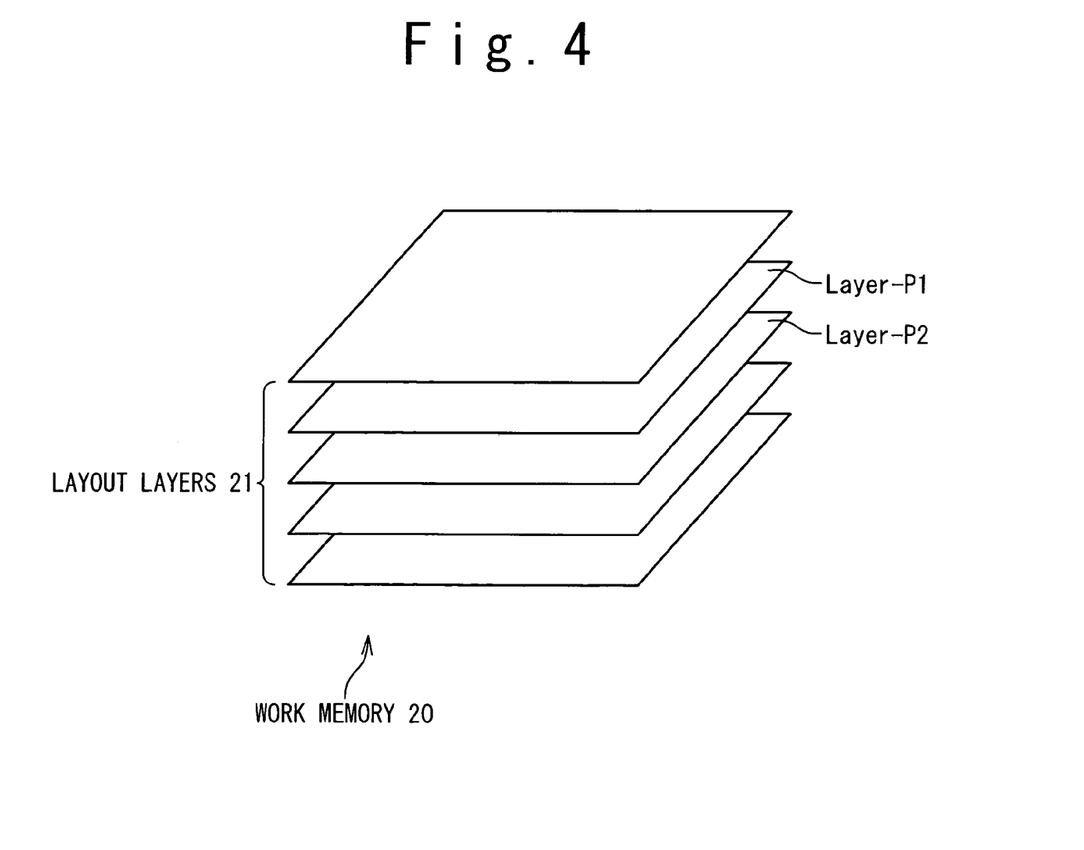
FIG. 4 is a conceptual view showing a plurality of layout layers in the LSI designing system according to the embodiment of the present invention.

At first, the layout editing tool 30 builds up a layout structure of the plurality of layout layers 21 on the work memory 20 in response to an instruction from the designer through the input section 60. In this case, the layout editing tool 30 refers to the layout layer definition file 11 stored in the database 10, and builds up the plurality of layout layers 21 on the work memory 20, as shown in FIG. 4. The plurality of layout layers 21 include the Layer-P1 where the lateral pattern structures are arranged, and the Layer-P2 where the longitudinal pattern structures are arranged.

Next, the designer uses the input section 60 to select one of the plurality of layout layers 21 and arranges the desirable pattern structures on the selected layout layer 21. That is, the designer inputs figure data of the desirable pattern structures.

Figure 5A:
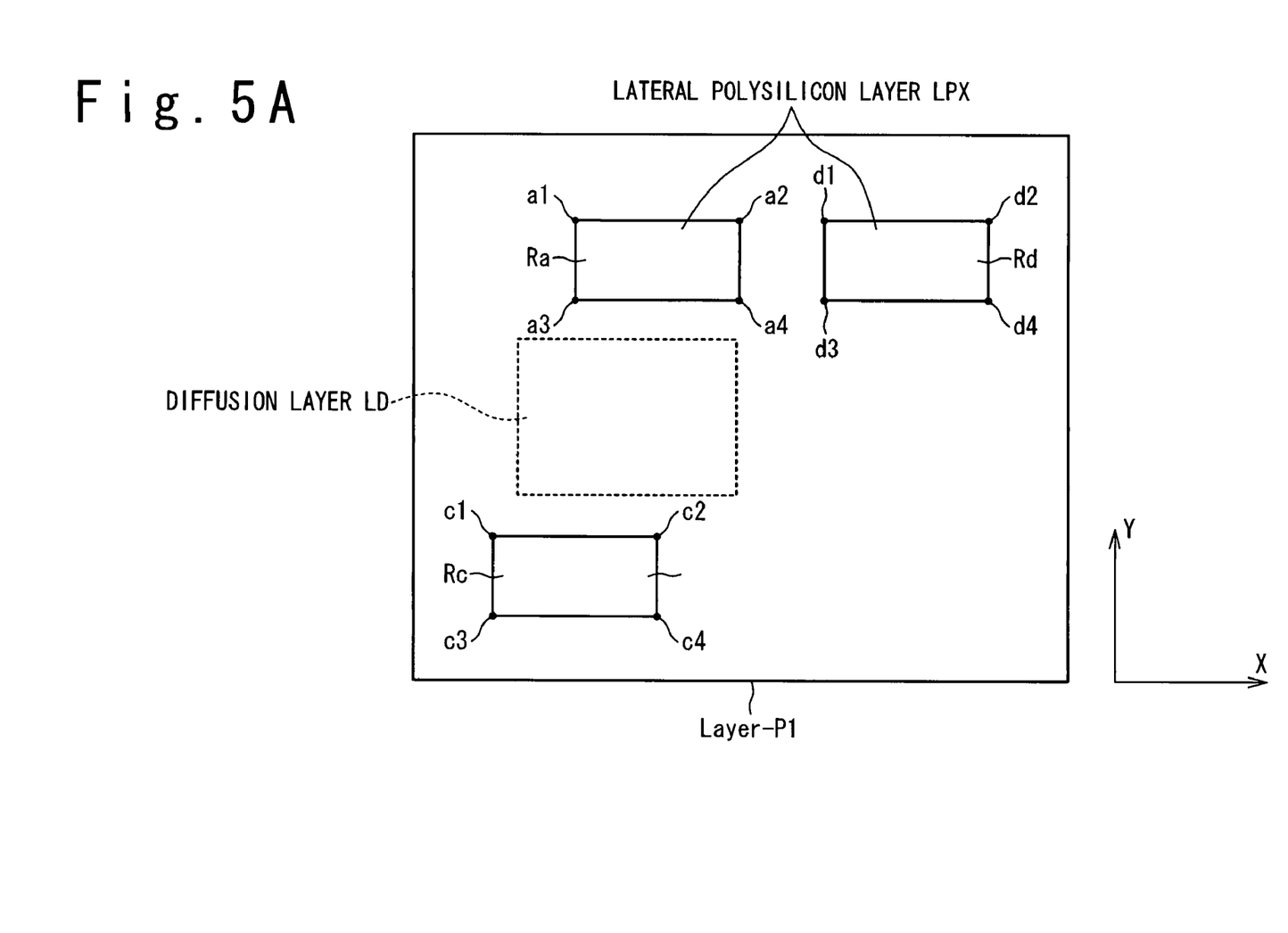
FIG. 5A is a conceptual diagram showing an operation of the LSI designing system according to the embodiment of the present invention.

For example, FIG. 5A shows the arrangement of the pattern structures of the Layer-P1. The designer firstly selects the Layer-P1 from the plurality of layout layers 21. Then, the designer arranges lateral pattern structures LPX as the plurality of lateral polysilicon layers corresponding to the regions Ra, Rc and Rd shown in FIG. 2 in the Layer-P1. Also, the designer inputs figure data of the plurality of longitudinal pattern structures LPX. Specifically, the figure data is inputted as the apex coordinates of each of the pattern structures Ra, Rc and Rd. That is, the designer gives coordinates a1 to a4 to the region Ra, gives coordinates c1 to c4 to the region Rc, and gives coordinates d1 to d4 to the region Rd. Consequently, the plurality of lateral pattern structures LPX are arranged in the Layer-P1. The layout editing tool 30 relates the inputted figure data to the Layer-P1 and generating a layout data element indicating correspondence relation between the inputted figure data to the Layer-P1 as a part of the layout data 90.

Figure 5B:
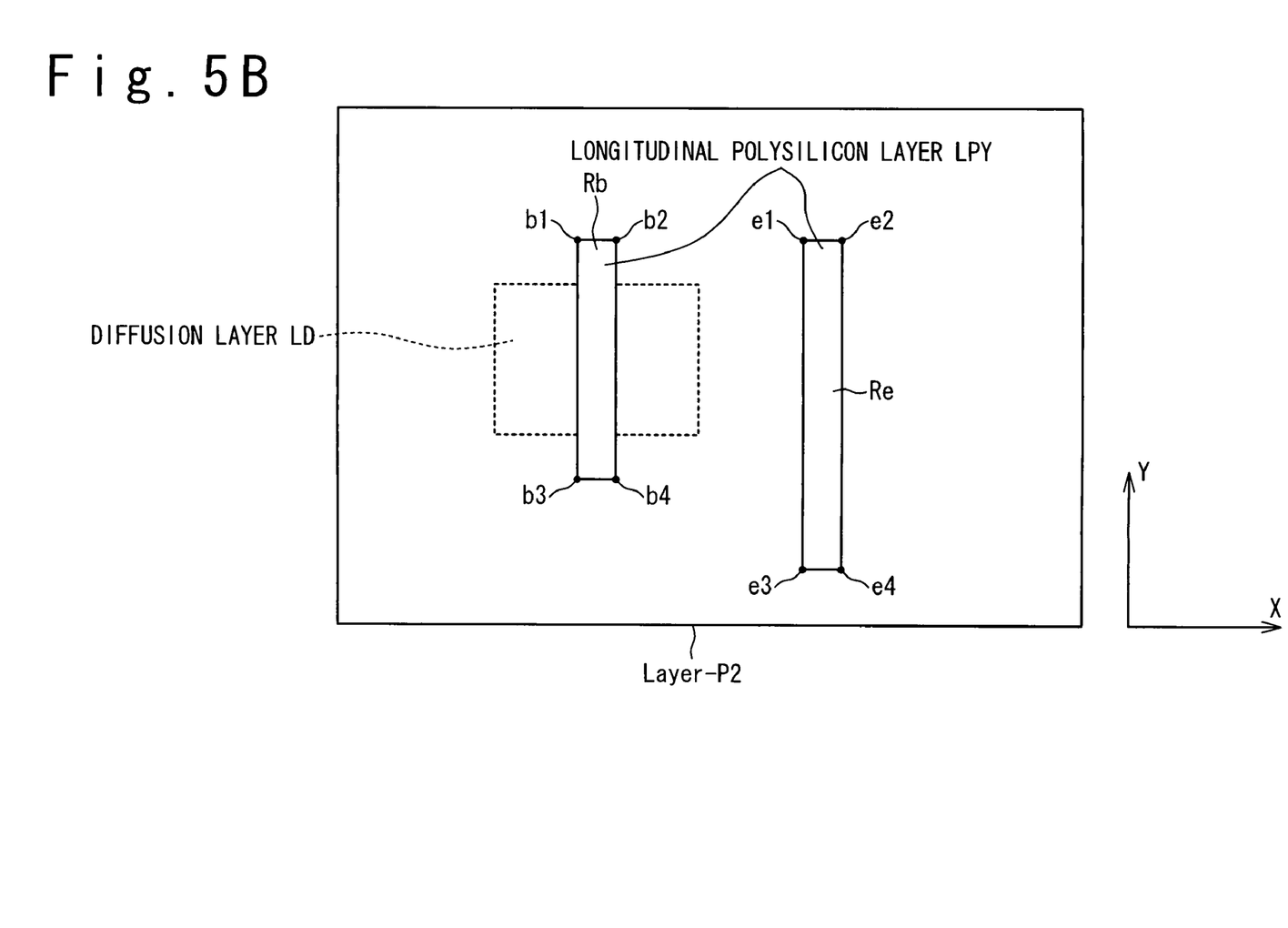
FIG. 5B is a conceptual diagram showing the operation of the LSI designing system according to the embodiment of the present invention.

Also, FIG. 5B shows the arrangement of the structures of the Layer-P2. The designer selects the Layer-P2 from the plurality of layout layers 21. Then, the designer arranges longitudinal pattern structures LPY as the plurality of longitudinal polysilicon layers corresponding to the regions Rb and Re shown in FIG. 2 in the Layer-P2. That is, the designer inputs the figure data to the plurality of longitudinal pattern structures LPY. Specifically, the figure data is inputted as the apex coordinates of each of the regions Rb and Re. That is, the designer gives coordinates b1 to b4 to the region Rb and gives coordinates e1 to e4 to the region Re. Consequently, the plurality of longitudinal pattern structures LPY are arranged in the Layer-P2. The layout editing tool 30 relates the input figure data to the Layer-P2 and generates a layout data element indicating correspondence relation between the input figure data to the Layer-P2 as a part of the layout data 90.

In this way, the layout editing tool 30 arranges each of the plurality of pattern structures in the corresponding layout layer 21 in response to an instruction of the designer. The designer refers to the designed LSI displayed on the output section 70 and repeatedly issues the instruction. In this way, the desirable pattern structures are arranged in each of the plurality of layout layers 21 containing the Layer-P1 and the Layer-P2. It should be noted that the designed LSI has a plurality of physical layers and each of the physical layers is assigned to at least one layout layer, or two or more layout layers in many cases. The layout editing tool 30 relates the inputted figure data and each layout layer 21 and generates a layout data element indicating the correspondence relation as a part of the layout data 90. In this way, the correspondence relation between the plurality of layout layers 21 and the arranged figure data, namely, the layout data 90 indicating the designed LSI is generated combining the plurality of layout layers 21 for one of physical layers of the designed LSI. The generated layout data 90 is stored in the storage section 80.

Figure 6:
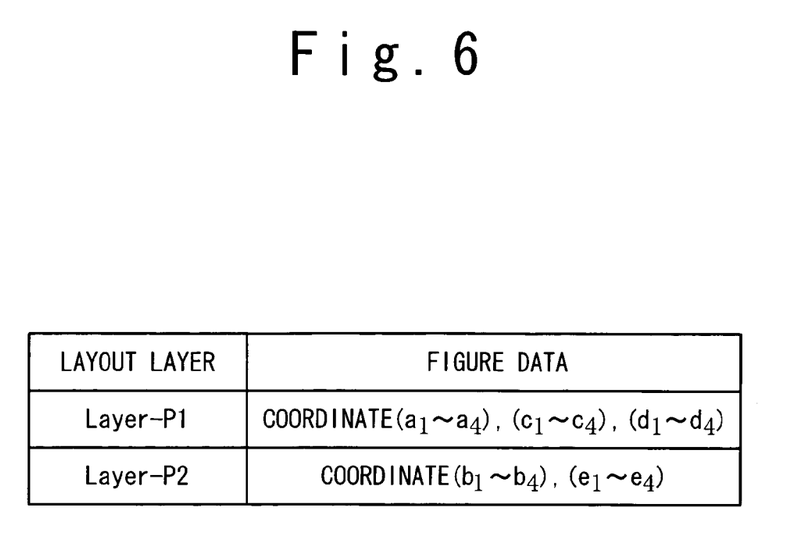
FIG. 6 is a view showing an example of a layout data according to the embodiment of the present invention.

FIG. 6 is a diagram showing a part of the layout data 90 generated in this embodiment. As shown in FIG. 6, the layout data 90 includes [First Layout Data Element] indicating the correspondence relation between the figure data (the coordinates a1 to a4, c1 to c4 and d1 to d4) of the lateral pattern structures LPX and the layout layer Layer-P1. Also, the layout data 90 includes [Second Layout Data Element] indicating the correspondence relation between the figure data (the coordinates b1 to b4, and e1 to e4) of the longitudinal pattern structures LPY and the layout layer Layer-P2. The first layout data element and the second layout data element are independently provided. In short, according to the present invention, the different layout data elements are produced based on the longer side direction of the divided pattern structure to the polysilicon layer LP formed in the same physical layer. The layout data elements can be similarly formed for pattern structures of any layers other than the polysilicon layer LP. In this way, the layout data 90 according to the present invention is generated to contain the plurality of independent layout data elements. Thus, each layout data element indicates the correspondence relation between the layout layer 21 where [Orientation] is defined and the figure data of each pattern structure arranged in it.

Next, the design rule verifying tool 40 verifies whether the designed LSI indicated by the layout data 90 meets the design rules, in response to an instruction from the designer through the input section 60. In this case, the design rule verifying tool 40 refers to the design rule file 12 stored in the database 10. If the generated designed LSI does not meet the design rules, the design rule verifying tool 40 outputs an error signal. The designer modifies the layout data 90, when the error signal is reported from the output section 70.

The effect of the LSI designing system 100 including the database 10 and layout data 90 according to the present invention is as follows. That is, according to the present invention, since the orientations are defined for the plurality of layout layers 21, the design rules is simplified as mentioned above. Also, the layout data 90 is generated based on the plurality of layout layers 21 having the orientations. Thus, the load of the computer is reduced when the layout data 90 is verified by using the design rules. Therefore, the time required to verify the layout data 90 is reduced. That is, the time necessary for the design and development of LSI is reduced. The foregoing effect is remarkable when the design rules of the LSI become finer and the LSI design becomes complex.

By the way, the above-mentioned examples indicate a case of designing the gate of the transistor. However, the application range of the present invention is not limited thereto. For example, the present invention can be applied to a wiring layer and a diffusion layer.

After the layout data 90 is generated as mentioned above, the reticle as a mask is produced which has a mask pattern corresponding to the layout data 90. Instead, the mask pattern may be directly drawn on a resist layer. In drawing the mask pattern, for example, [Electric Beam (EB) Drawing Apparatus] is used. For this reason, it is necessary to convert the layout data 90 into [EB Data] having the format suitable for the EB drawing apparatus (EB Data Converting Process).

Figure 7:
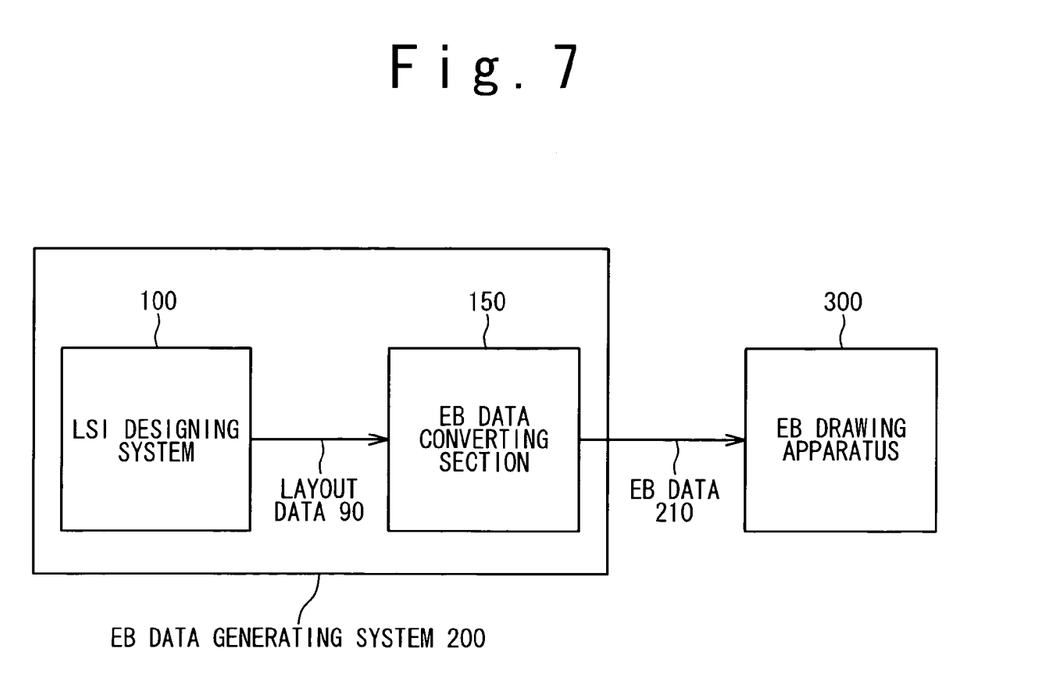
FIG. 7 is a block diagram showing a configuration of an EB data generating system according to the embodiment of the present invention.

FIG. 7 is a block diagram showing a configuration of the EB data generating system for carrying out the foregoing EB data converting process. The EB data generating system 200 includes the LSI designing system 100 according to the present invention and an EB data converting section 150 connected to the LSI designing system 100. The LSI designing system 100 generates the layout data 90 as mentioned above and outputs the layout data 90 to the EB data converting section 150. The EB data converting section 150 carries out a figure calculating process such as an inter-layer logic calculation and a white/black inverting process, and consequently converts the layout data 90 into an EB data 210. Then, the EB data converting section 150 outputs the EB data 210 to an EB drawing apparatus 300. The EB drawing apparatus 300 draws the mask pattern on a resist layer in accordance with the received EB data 210.

As shown in FIG. 2, the lateral pattern structures LPX and the longitudinal pattern structures LPY are formed in a same physical layer such that they are connected to each other in the same physical layer. For this reason, when they are considered as a whole, the polysilicon layers LP may have a geometrically complex shape. In the EB data converting process, if the figure calculating process is carried out on the entire polysilicon layer LP, the computer is burdened with a heavy load. However, according to the present invention, the polysilicon layer LP is divided into the plurality of regions Ra to Re, and each of the Layer-P1 and the Layer-P2 is separately assigned to corresponding one of the lateral pattern structures LPX and the longitudinal pattern structures LPY, as shown in FIGS. 5A and 5B. Then, since the figure calculating process is carried out on the pattern structures simpler than the entire polysilicon layers LP, the load on the computer in the EB data converting process is reduced. That is, the time necessary for the EB data converting process is reduced, and the time necessary for the design and development of the LSI is reduced. The foregoing effect becomes evident when the design rules of the LSI become finer and the designed LSI becomes further complex. It should be noted that in the generated EB data, the lateral pattern structures and the longitudinal pattern structures are stacked or overlapped. Thus, similarly to the conventional technique, the mask pattern of the entire polysilicon layers is formed on the same reticle as a mask. The LSI can be manufactured by using the masks, as known to a person in the art.

Figure 8:
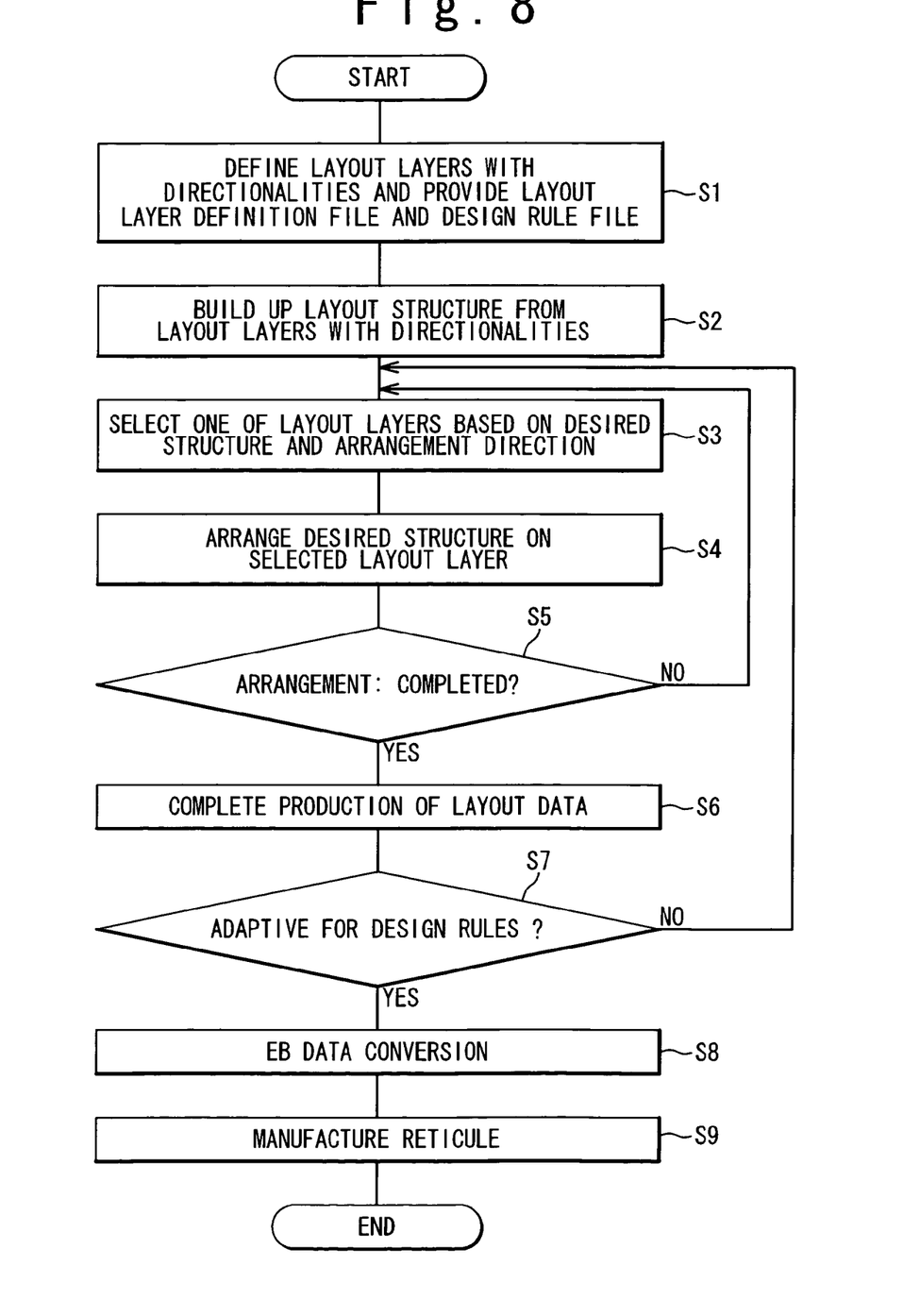
FIG. 8 is a flowchart showing an LSI designing method according to the embodiment of the present invention.

FIG. 8 is a flowchart showing the LSI designing method according to the present invention.

At first, the layout layer definition file 11 and the design rule file 12 are provided (Step S1). The layout layer definition file 11 assigns each of the pattern structures to one of the plurality of layout layers 21 based on the longer side direction of each pattern structure (refer to FIG. 3). Also, the design rule file 12 indicates the design rules to each of the plurality of layout layers 21.

Next, the plurality of layout layers 21 defined in the layout layer definition file 11 are formed or built up in the work memory 20 (Step S2). The plurality of layout layers 21 includes: the Layer-P1 where the lateral pattern structures LPX are arranged; and the Layer-P2 where the longitudinal pattern structures LPY are arranged (refer to FIG. 4).

Next, the designer selects one of the plurality of layout layers 21 on the basis of the longer side direction of the pattern structure (Step S3). In succession, by giving the figure data to the desired pattern structure, the designer arranges the desired pattern structure in the selected layout layer 21 (refer to FIGS. 5A, 5B). The layout editing tool 30 relates the inputted figure data to the selected layout layer 21 and adds the layout data element indicating the correspondence relation to the layout data 90 (Step S4).

Until the completion of the arrangement of all of the pattern structures corresponding to the desired LSI, the foregoing steps S3 and S4 are repeated (Step S5; No). In the way, all of the pattern structures are arranged (Step S5; Yes), and the design of the desired LSI is established on the work memory 20. Thus, the layout data 90 indicating the layout of the designed LSI is completed (Step S6). The layout data 90 indicates the correspondence relation between the plurality of layout layers 21 and the figure data (refer to FIG. 6).

Next, the design rule verifying tool 40 verifies whether or not the designed LSI or the layout data meets the design rules defined by the design rule file 12 (Step S7). If the designed LSI does not meet the design rules (Step S7; No), the foregoing steps S3 to S6 are repeated, to modify the layout data 90. Since the designed LSI meets the design rules (Step S7; Yes), the final layout data 90 is generated. Thereafter, the layout data 90 is converted into the EB data 210 by the EB data converting section 150 (Step S8). The EB drawing apparatus 300 uses the EB data 210 and consequently produces the reticle having the designed pattern (Step S9).

As mentioned above, according to the present invention, the design rules is simplified. Also, according to the layout data 90 of the present invention, the time required to verify the satisfaction of the design rules and the time necessary for the EB data converting process are reduced. Moreover, according to the LSI designing system 100, the database 10 used therein, the LSI designing method, and the EB data generating system 200 of the present invention, the time required to verify the layout data 90 and the time necessary for the EB data converting system are reduced. Thus, the time necessary for the design and development of the LSI is reduced.

According to the present invention, the design rules is simplified. Also, according to the layout data structure based on the present invention, the time required to verify the agreement with the design rules and the time necessary for the EB data converting process are reduced. Also, according to the LSI designing system based on the present invention, the database used therein, the LSI designing method, and the EB data generating system, the time required to verify the layout data and the time necessary for the EB data converting process are reduced. In addition, according to the layout data structure based on the present invention, the LSI designing system, the database used therein, the LSI designing method, and the EB data generating system, the time necessary for the LSI design and development is reduced.

What is claimed is:

1. An LSI designing system comprising:
a memory;
a database configured to store a layout layer definition file; and
a control section configured to refer to said database to build up a plurality of layout layers in said memory based on said layout layer definition file,
wherein said plurality of layout layers are provided for extending directions of patterns in one of physical layers of an LSI to be formed, and
said control section divides each of said patterns into pattern structures based on said extending directions, and assigns each of said pattern structures to a corresponding one of said plurality of layout layers,
wherein said control section carries out the building up of said plurality of layout layers over all of the physical layers of the LSI to be formed, and the assignment of each of said pattern structures to a corresponding layout layer, and
wherein said database further stores a design rule file, said control section refers to said design rule file to check whether each of said plurality of layout layers meets design rules defined in said design rule file.

2. The LSI designing system according to claim 1, wherein said control section produces a layout data for said physical layer by combining said plurality of layout layers.

3. The LSI designing system according to claim 1, wherein said control section assigns said pattern structures to said corresponding layout layer by specifying apexes of each of said pattern structures.

4. The LSI designing system according to claim 1, wherein said extending directions are orthogonal to each other.

5. An electron beam drawing system comprising:
an electron beam data generating system configured to generate an electron beam data for one of physical layers of an LSI to be formed; and
an electron beam drawing apparatus configured to draw a mask pattern based on said electron beam data,
wherein said electron beam data generating system comprises:
an LSI designing system configured to generate a layout data for said physical layer; and
a converting unit configured to convert said layout data into said electron beam data,
said LSI designing system comprises:
a memory;
a database configured to store a layout layer definition file; and
a control section configured to refer to said database to build up a plurality of layout layers in said memory based on said layout layer definition file,
said plurality of layout layers are provided for extending directions of patterns in said physical layer, and
said control section divides each of said patterns into pattern structures based on said extending directions, assigns each of said pattern structures to a corresponding one of said plurality of layout layers, and produces said layout data for said physical layer by combining said plurality of layout layers,
wherein said control section carries out the building up of said plurality of layout layers over all of the physical layers of the LSI to be formed, and the assignment of each of said pattern structures to a corresponding layout layer, and
wherein said database further stores a design rule file, said control section refers to said design rule file to check whether each of said plurality of layout layers meets design rules defined in said design rule file.

6. The electron beam drawing system according to claim 5, wherein said control section assigns said pattern structures to said corresponding layout layer by specifying apexes of each of said pattern structures.

7. The electron beam drawing system according to claim 5, wherein said extending directions are orthogonal to each other.

8. A method of manufacturing an LSI, comprising:
generating a layout data for one of physical layers of said LSI to be manufactured;
producing a mask based on said layout data; and
manufacturing said LSI by using said mask,
wherein said generating a layout data comprises:
building up a plurality of layout layers in a memory based on a layout layer definition file, wherein said plurality of layout layers are provided for extending directions of patterns in said physical layer of said LSI;
dividing each of said patterns into pattern structures based on said extending directions;
assigning each of said pattern structures to a corresponding one of said plurality of layout layers; and
generating said layout data for said physical layer by combining said plurality of layout layers,
checking whether each of said plurality of layout layers meets design rules defined in a design rule file,
wherein said building up of said plurality of layout layers comprises building up over all of the physical layers of the LSI to be formed.

9. The method according to claim 8, wherein said assigning comprises:
assigning said pattern structures to said corresponding layout layer by specifying apexes of each of said pattern structures.

10. The method according to claim 8, wherein said extending directions are orthogonal to each other.

11. The method according to claim 8, wherein said generating a layout data is carried out over all of said physical layers.

12. The method according to claim 8, wherein said producing a mask comprises:
generating an electron beam data for said physical layer; and
drawing a mask pattern based on said electron beam data to produce said mask.

13. A layout data generating method comprising:
building up a plurality of layout layers in a memory based on a layout layer definition file, wherein said plurality of layout layers are provided for extending directions of patterns in said physical layer of said LSI;
dividing each of said patterns into pattern structures based on said extending directions;
assigning each of said pattern structures to a corresponding one of said plurality of layout layers; and
generating said layout data for said physical layer by combining said plurality of layout layers,
checking whether each of said plurality of layout layers meets design rules defined in a design rule file,
wherein said building up of said plurality of layout layers comprises building up over all of the physical layers of the LSI to be formed.

14. The layout data generating method according to claim 13, wherein said assigning comprises:
assigning said pattern structures to said corresponding layout layer by specifying apexes of each of said pattern structures.

15. The layout data generating method according to claim 13, wherein said extending directions are orthogonal to each other.

* * * * *